(12) United States Patent
Loraine et al.

(10) Patent No.: US 12,513,933 B2
(45) Date of Patent: Dec. 30, 2025

(54) TRANSFER PRINTING FOR RF APPLICATIONS

(71) Applicant: X-FAB France SAS, Corbeil-Essonnes (FR)

(72) Inventors: Jérôme Loraine, Corbeil-Essonnes (FR); Imène Lahbib, Corbeil-Essonnes (FR); Frédéric Drillet, Corbeil-Essonnes (FR); Brice Grandchamp, Corbeil-Essonnes (FR); Lucas Iogna-Prat, Corbeil-Essonnes (FR); Gregory U'Ren, Corbeil-Essonnes (FR)

(73) Assignee: X-FAB France SAS, Corbeil-Essonnes (FR)

( * ) Notice: Subject to any disclaimer, the term of this patent is extended or adjusted under 35 U.S.C. 154(b) by 234 days.

(21) Appl. No.: 17/186,032

(22) Filed: Feb. 26, 2021

(65) Prior Publication Data

US 2021/0273085 A1  Sep. 2, 2021

(30) Foreign Application Priority Data

Feb. 28, 2020  (GB) .................................... 2002895

(51) Int. Cl.
*H01L 29/778* (2006.01)
*H01L 21/56* (2006.01)
*H01L 23/31* (2006.01)
*H10D 30/47* (2025.01)
*H10D 62/85* (2025.01)

(52) U.S. Cl.
CPC .......... *H10D 30/475* (2025.01); *H01L 21/56* (2013.01); *H01L 23/3171* (2013.01); *H10D 62/8503* (2025.01)

(58) Field of Classification Search
CPC . H01L 29/7786; H01L 21/56; H01L 23/3171; H01L 29/2003; H01L 23/585; H01L 23/562; H01L 29/66462; H01L 29/7787; H01L 2221/68304; H01L 21/7806
USPC .......................................................... 257/76
See application file for complete search history.

(56) References Cited

U.S. PATENT DOCUMENTS 5,798,298 A * 8/1998 Yang .................. H01L 21/76819
                                                   257/E21.582
7,105,798 B2 * 9/2006 Wang .................. H01L 27/1443
                                                   257/E27.128

(Continued)

FOREIGN PATENT DOCUMENTS

| CN | 102881722 A | * | 1/2013 |
| FR | 3096172 | | 11/2020 |
| JP | 2000/349113 | | 12/2000 |

OTHER PUBLICATIONS

UK Combined Search and Examination Report for corresponding Application No. GB2002895.7, Jul. 24, 2020, 8 pages.

(Continued)

*Primary Examiner* — Duy T Nguyen
*Assistant Examiner* — Pratiksha Jayant Lohakare
(74) *Attorney, Agent, or Firm* — Dority & Manning, P.A.

(57) ABSTRACT

A semiconductor structure for RF applications comprises:
a target substrate;
a micro-transfer printed (µTP) gallium nitride (GaN) chiplet on said target substrate, wherein said chiplet comprises a GaN device and a dummy metal layer.

12 Claims, 7 Drawing Sheets

(56) References Cited

U.S. PATENT DOCUMENTS

| | | | |
|---|---|---|---|
| 8,969,915 B2* | 3/2015 | Lee | H01L 29/872 257/183 |
| 9,153,548 B2* | 10/2015 | Chan | H01L 27/156 |
| 9,226,383 B2* | 12/2015 | Mishra | H05K 1/181 |
| 9,929,053 B2* | 3/2018 | Bower | H01L 21/561 |
| 10,312,405 B2* | 6/2019 | Bower | H01L 21/7806 |
| 10,395,966 B2* | 8/2019 | Bower | B65G 47/91 |
| 10,777,521 B2* | 9/2020 | Meitl | H01L 24/11 |
| 10,854,573 B2* | 12/2020 | Ji | H01L 24/96 |
| 10,964,583 B2* | 3/2021 | Bower | H01L 24/14 |
| 11,205,630 B2* | 12/2021 | Elsherbini | H01L 25/0657 |
| 2004/0129991 A1* | 7/2004 | Lai | H01L 31/0203 257/433 |
| 2005/0211989 A1* | 9/2005 | Horio | H10H 20/832 257/E33.068 |
| 2006/0071226 A1* | 4/2006 | Kojima | H10H 20/835 257/E33.068 |
| 2007/0023746 A1* | 2/2007 | Birau | H01L 51/5253 257/40 |
| 2008/0236872 A1* | 10/2008 | Kataoka | H05K 3/06 29/829 |
| 2009/0194856 A1* | 8/2009 | Gomez | H01L 23/49503 257/676 |
| 2011/0286083 A1* | 11/2011 | Toyonaka | H01L 31/035281 359/333 |
| 2012/0243824 A1* | 9/2012 | Takabayashi | H01L 31/035281 385/14 |
| 2013/0288401 A1* | 10/2013 | Matsuura | H01L 29/4175 438/14 |
| 2015/0014706 A1* | 1/2015 | Sadwick | H01L 29/66431 257/77 |
| 2015/0179873 A1* | 6/2015 | Wunderer | H01L 33/0025 257/13 |
| 2015/0187599 A1* | 7/2015 | Ko | H01L 21/283 438/492 |
| 2015/0372393 A1 | 12/2015 | Bower | |
| 2016/0093600 A1* | 3/2016 | Bower | H01L 25/0753 257/89 |
| 2017/0250167 A1* | 8/2017 | Bower | H01L 24/97 |
| 2017/0338542 A1 | 11/2017 | Cok | |
| 2018/0025986 A1* | 1/2018 | Chiu | H01L 23/3114 257/531 |
| 2018/0061712 A1* | 3/2018 | Mols | H01L 21/76251 |
| 2018/0108698 A1* | 4/2018 | Peng | H01L 27/1464 |
| 2018/0138071 A1* | 5/2018 | Bower | H10H 20/831 |
| 2018/0254217 A1* | 9/2018 | Grivna | H01L 23/49827 |
| 2019/0088630 A1* | 3/2019 | Cok | H01L 24/82 |
| 2019/0252296 A1* | 8/2019 | Hung | H01L 25/0657 |
| 2020/0294912 A1* | 9/2020 | Tai | H01L 23/3677 |

OTHER PUBLICATIONS

Preliminary Search Report for corresponding French Application No. FR 2101888, 1 page.

* cited by examiner

TRANSFER PRINTING FOR RF APPLICATIONS

TECHNICAL FIELD

The present invention concerns semiconductor structures for Radio-Frequency (RF) applications, and in particular semiconductor structures comprising a micro-transfer printed Gallium Nitride (GaN) chiplet on a target substrate.

BACKGROUND

GaN is a relatively new technology compared to other semiconductors, such as Silicon (Si) and Gallium Arsenide (GaAs), but it has become the technology of choice for RF, power-hungry applications like those required to transmit signals over long distances or at high-end power levels. GaN transistors provide high power density, high operating temperatures, improved efficiency, low on-resistance, and they can be operated in different frequency bands ranging from 20 kHz to 300 GHz.

Figure 1:
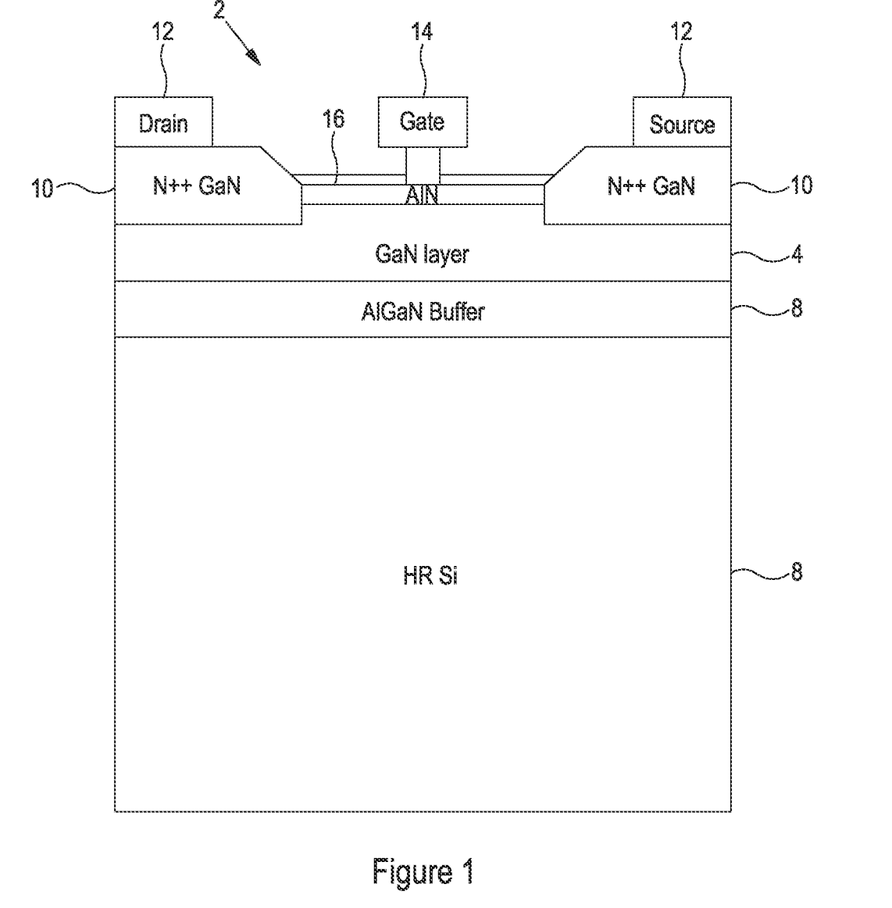
FIG. 1 is a schematic cross-section of a GaN transistor on a silicon substrate.

FIG. 1 shows a schematic diagram of a cross-section of a GaN transistor 2. The GaN layer 4 is formed on a high resistivity (HR) silicon substrate 6 and an Aluminium Gallium Nitride (AlGaN) buffer layer 8. Heavily n doped (n++) regions 10 of the GaN are connected to metal contacts 12 (drain and source). The gate 14 is isolated from the GaN layer 4 by a thin Aluminium Nitride (AlN) layer 16.

Silicon on insulator (SOI) technology is used in semiconductor manufacturing, especially microelectronics, to reduce parasitic capacitance by having a layered silicon-insulator-silicon substrate structure (rather than bulk Si). SOI Complementary Metal-Oxide Semiconductor (CMOS) provides lower power consumption for analogue and digital RF mixed circuits in the design of low power RF transceivers thanks to its low leakage capabilities.

To achieve some of the advantages of both GaN and SOI in high power applications, attempts have been made to grow GaN on SOI, using trench etching to isolate GaN transistors. Careful strain engineering is required to control the stress built up in the wafer during growth.

Alternatively, micro-transfer printing (μTP) [1] can be used to transfer a GaN device from a native/source wafer to a target SOI wafer. In this process, the GaN device is detached/lifted from the native substrate it was grown on and re-attached on the SOI substrate. A chiplet is a (small) piece of chip for which the native substrate has been removed.

[1] R. Lerner, and all "Heterogeneous Integration of Microscale Gallium Nitride Transistors by Micro-Transfer-Printing". 2016 IEEE 66th Electronic Components and Technology Conference, pp 1186-1189.

SUMMARY OF THE INVENTION

Aspects of the present invention provide semiconductor structures for RF applications and methods of forming such semiconductor structures as set out in the accompanying claims.

Preferred embodiments of the invention will now be described, by way of example only, with reference to the accompanying drawings.

DETAILED DESCRIPTION

Embodiments described herein provide a semiconductor structure for RF applications. For example, the semiconductor structure may be a low noise amplifier (LNA) or a single pole double throw (SPDT) switch. The semiconductor structure comprises a target substrate, preferably being a SOI wafer or die, and a micro-transfer printed GaN chiplet on said target substrate, wherein said chiplet comprises a GaN device (typically a GaN transistor, e.g. a pseudomorphic High Electron Mobility Transistor: p-HEMT) and a dummy metal layer. The dummy metal layer increases the mechanical strength of the chiplet, and can thereby reduce warping and prevent cracking during the micro-transfer printing process.

A chiplet, as mentioned above, is a (small) piece of chip for which the native substrate has been removed. In semiconductor structures for RF applications the GaN layer and the buffer layer need to be thin in order to meet specification standards. However, a thin GaN chiplet makes micro-transfer printing more difficult due to a greater amount of bending of the chiplet as it is released from the underlying silicon substrate during transfer to the SOI wafer. The μTP GaN chiplet may comprise a buffer layer (e.g. AlGaN) and a GaN layer having combined thickness less than 3 μm. For example, the buffer layer may have a thickness of 1 μm and the GaN layer on top may have a thickness of 1.8 μm, so that the combined thickness is only 2.8 μm. This may be substantially thinner than the thickness of a GaN semiconductor structure for high-power applications, for which existing micro-transfer printing techniques are suitable, where the GaN layer alone typically has a thickness of 5 μm The dummy metal layer can have a thickness in the range of 0.3 μm to 4 μm, and preferably a thickness of 1.25 μm, which can provide sufficient mechanical strength. Advantageous properties in terms of mechanical strength of the chiplet have been found for a dummy metal layer having a thickness in the range of 1 μm to 2 μm. "Dummy" in this context refers to the fact that the dummy metal layer is not used to form any electrical connections, and does not (significantly) affect the final device performance. The GaN device normally comprises a device metal layer for electrical connections to the GaN device (i.e. for electrical connections to doped regions in the GaN layer), and the dummy metal layer does not contact the device metal layer. Both the dummy metal layer and the device metal layer may advantageously be formed in the top metal layer of the backend stack of the GaN device, and are separated when patterning the top metal layer. For example, the gap between the dummy metal layer and the device metal layer can have a width of at least 10 µm, to avoid capacitive effects that could negatively affect device performance. For devices operating at frequencies below 5 GHz, a smaller gap may be used, while for high frequency applications (e.g. >20 GHZ) a gap of at least 30 µm may be preferable. For GaN transistors, the device metal layer comprises metal contacts such as source, drain and gate contacts.

The dummy metal layer and the device metal layer can be arranged so that metal is substantially uniformly distributed on said µTP GaN chiplet. Uniformly distributing the metal across the GaN chiplet can improve the mechanical properties of the chiplet and further reduce the occurrence of defects during micro-transfer printing. For this purpose, the dummy metal layer may also be substantially symmetrically arranged on said µTP GaN chiplet. The dummy metal layer and/or the device metal layer may have x and/or y symmetry. To increase the mechanical strength of the GaN chiplet, it may be advantageous to cover a large proportion of the surface area of the chiplet with metal. The dummy metal layer and the device metal layer may together cover between 20% and 90% of the total surface area of the µTP GaN chiplet.

The SOI wafer may be a 200 mm (8 inch) thin SOI wafer, which is suitable for semiconductor structures for RF applications. Micro-transfer printing of GaN on an SOI wafer enables monolithic designs with shorter interconnections, which can prevent losses and transitions between chips and substrates. When micro-transfer printing, one or more chiplets, each containing one or more GaN devices, can be lifted from a native silicon substrate and placed on the SOI wafer. The SOI wafer may comprise a passivation layer on top, to which the GaN chiplet can be attached. The µTP GaN chiplet may be attached to the SOI wafer by a layer of glue.

Described herein are also embodiments of a method of forming a semiconductor structure for RF applications. The method comprises providing a GaN chiplet comprising one or more GaN devices and a dummy metal layer, and micro-transfer printing the GaN chiplet onto a SOI wafer.

The step of providing may comprise depositing a metal layer (typically the top metal layer) and patterning the metal layer to form the dummy metal layer and to form a device metal layer comprising metal contacts for electrical connections to said GaN device.

Figure 2:
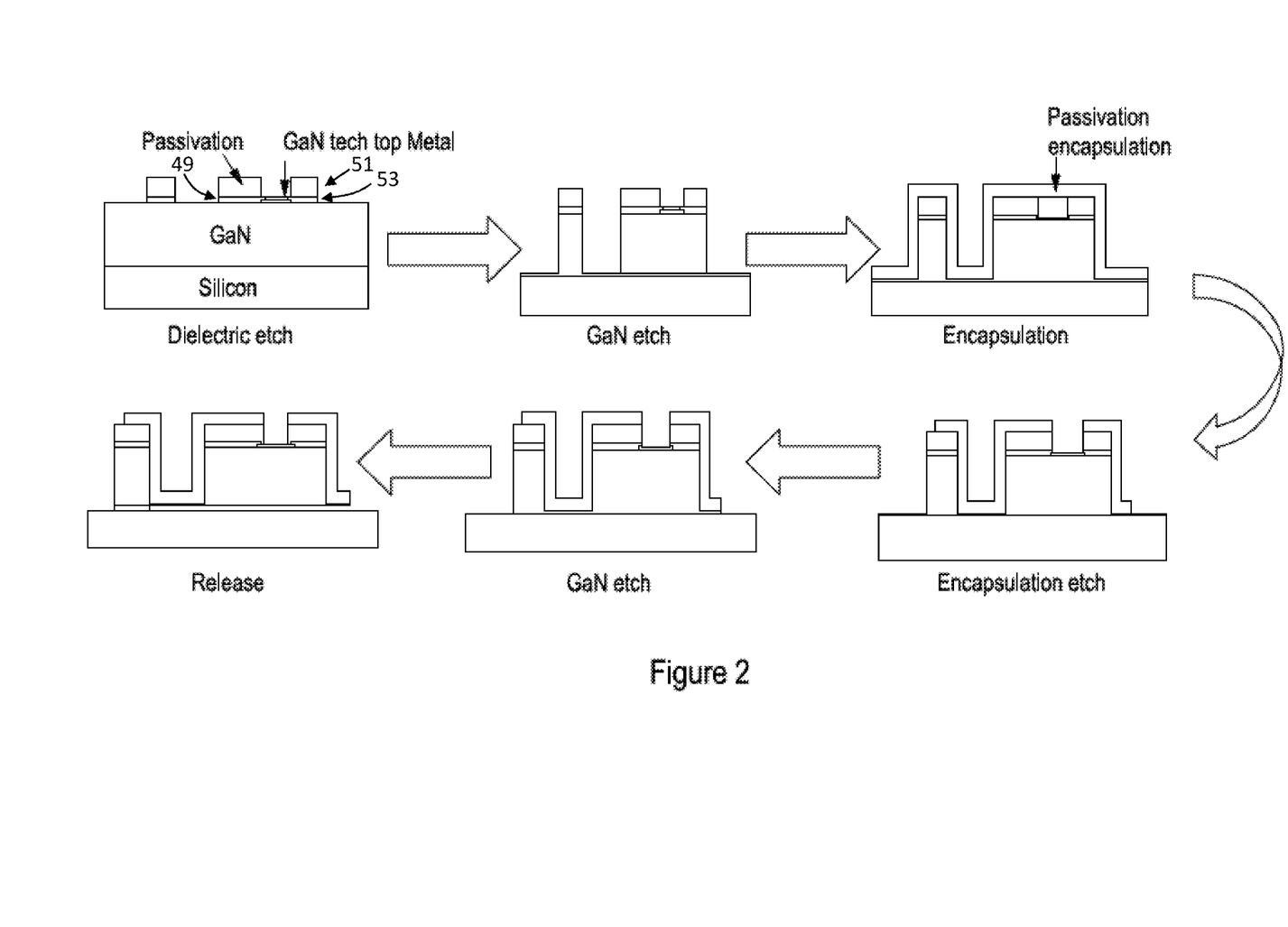
FIG. 2 shows a sequence of cross sections of a GaN transistor on a silicon substrate, illustrating the release process during micro-transfer printing.

FIG. 2 illustrates some of the steps of releasing a GaN chiplet from a native silicon substrate. The passivation layer and the dielectric layers 49 of the backend stack 51 of the GaN device(s) are etched to reveal the underlying GaN layer around the chiplet. A GaN etch is then performed to isolate the GaN chiplet, followed by deposition of an encapsulation layer (e.g. SiN) to protect the chiplet. The encapsulation layer is etched to reveal the top metal of metal layers 53 of the GaN chiplet for forming connections to the SOI wafer after transfer printing. Another GaN etch is performed around the chiplet to reveal the underlying silicon substrate, followed by the release of the chiplet by etching the silicon substrate underneath the GaN chiplet. After release, the GaN chiplet can be transferred and glued to an SOI wafer (not shown).

In embodiments described herein, the thickness of the encapsulation layer can be used in addition to the dummy metal layer to compensate for the mechanical stress of the GaN chiplet. For example, a thicker encapsulation layer may be used in the µTP process to provide more support for the chiplet. For example, an encapsulation layer with increased thickness may have a thickness in the range of 0.5 µm to 3 µm. The exact thickness depends on the type of stress of the deposited encapsulation layer and the type of stress within the GaN chiplet. Also, the frequency of deposition (i.e. the frequency of the RF generator used to excite the plasma in the deposition tool) of the encapsulation layer can be changed to correct the chiplet curvature. For example, using Plasma Enhanced Chemical Vapor Deposition (PECVD) or a similar tool, the frequency of the RF generator can modify the stress of the deposited layer.

Figure 3:
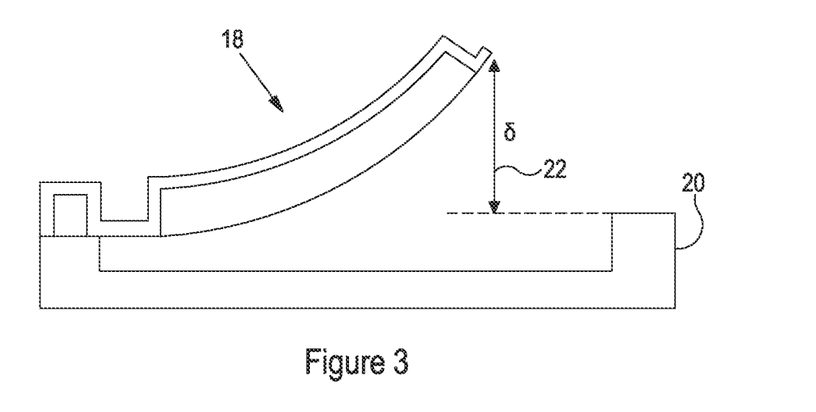
FIG. 3 is a schematic cross-section of a GaN chiplet being deflected due to mechanical stresses.

FIG. 3 shows a cross section of a thin GaN chiplet 18 released from its native silicon wafer 20. To relax mechanical stress, the chiplet 18 curves like a cantilever having an end displacement/deflection 22 (δ). Stoney's formula can be used to estimate the end displacement (δ) of a cantilever for a given stress (σ):

$$\delta = \frac{3\sigma(1-v)}{E}\frac{L^2}{t^2} \quad (1)$$

where δ is the end deflection of the cantilever (i.e. of the chiplet in this case), o is the applied stress, v is Poisson's ratio, E is Young's modulus, L is the length and t is the thickness of the cantilever.

Using equation 1, for an RF GaN chiplet (having a GaN layer thickness of 1.8 µm) without a dummy metal layer and σ=107 Pa, δ=3.83 µm. This is a relatively large deflection compared to that of a high power GaN chiplet (having a GaN layer thickness of 5 µm), for which δ=0.5 µm under the same applied stress. Hence, using existing micro-transfer printing techniques that are suitable for high power GaN, may cause cracking and thereby very low release and print yields if directly applied to the thinner RF GaN chiplets. However, an RF GaN chiplet (having a GaN layer thickness of 1.8 µm) comprising a dummy metal layer having a thickness of 1.25 µm has δ=0.54 µm (for σ=107 Pa), which is much closer to that of the high power GaN chiplet. Using a dummy metal layer can thereby significantly improve the release and print yields of GaN chiplets for RF applications.

Figure 4A:
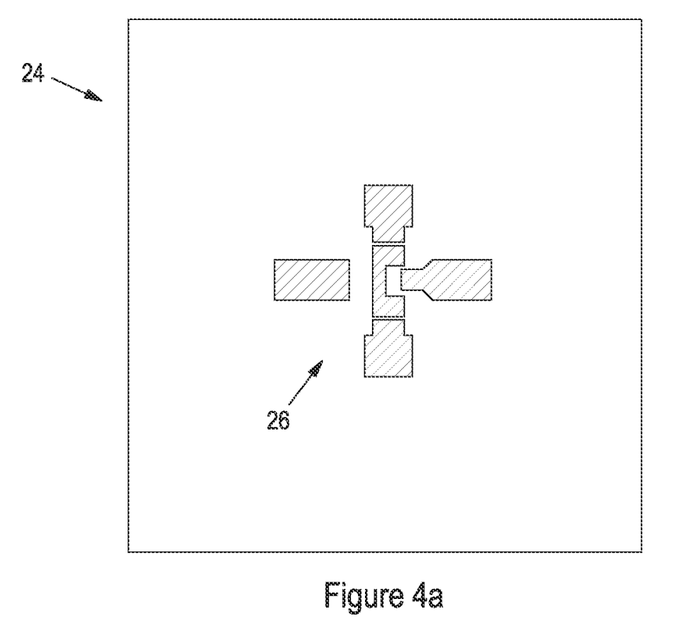
FIG. 4a is a schematic top view of a GaN chiplet without a dummy metal layer.

FIG. 4a shows a schematic top view of a GaN chiplet 24 comprising one or more GaN devices (not shown) being, for example, one or more of a transistor, a resistor and a transmission line. The chiplet 24 comprises a device metal layer 26 being the transistor top metal layer for connecting to the GaN device (e.g. source, drain and gate connections).

Figure 4B:
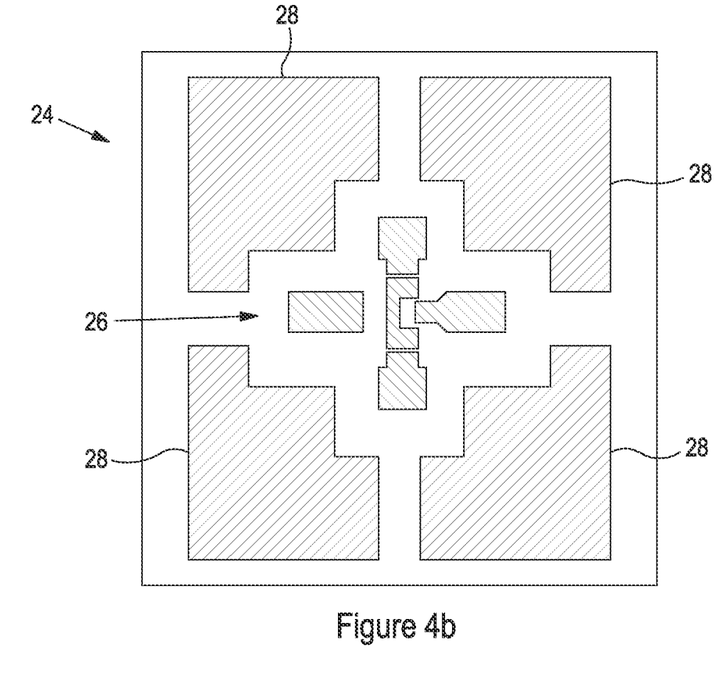
FIG. 4b is a schematic top view of the GaN chiplet with a dummy metal layer.

FIG. 4b shows a schematic top view of a corresponding GaN chiplet 24 comprising the same GaN device and device metal layer 26, and further comprising a dummy metal layer 28 substantially symmetrically arranged on the chiplet 24. Similar or corresponding features have been given the same reference numerals for ease of understanding and the reference numerals are not intended to be limiting. The metal on the chiplet (including the dummy metal and the device metal) is uniformly distributed across the surface of the chiplet 24 (unlike the chiplet in FIG. 4a, where the metal was concentrated at the center of the chiplet). The device metal layer 26 covers 4.3% of the surface area of the chiplet 24 and the dummy metal layer 28 covers 44.4% of the surface area of the chiplet, such that a total of 48.7% of the surface area of the chiplet is covered by metal (i.e. 48.7% total chiplet density). This GaN device cannot in general be successfully micro-transfer printed without the dummy metal layer 28.

Figure 5A:
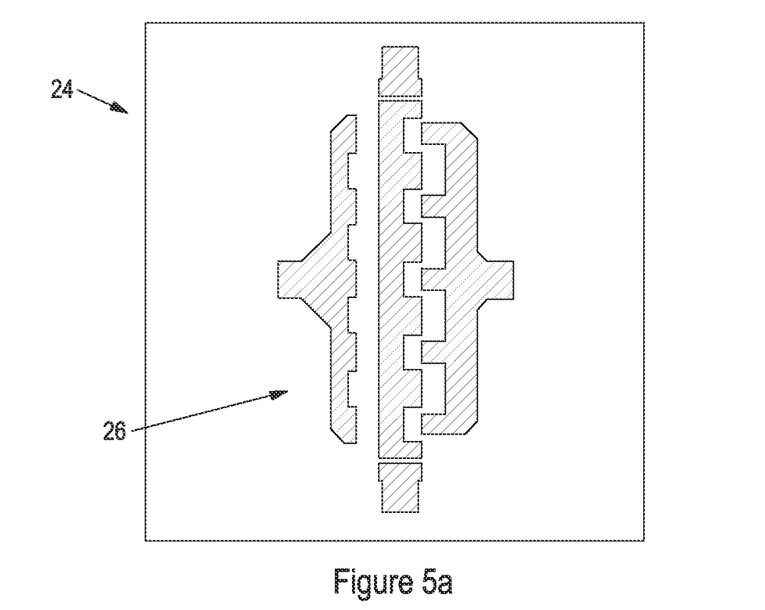
FIG. 5a is a schematic top view of a second GaN chiplet without a dummy metal layer.

FIG. 5a shows a schematic top view of a GaN chiplet 24 comprising a different GaN device (not shown) and device metal layer 26 for connecting to the GaN device 26.

Figure 5B:
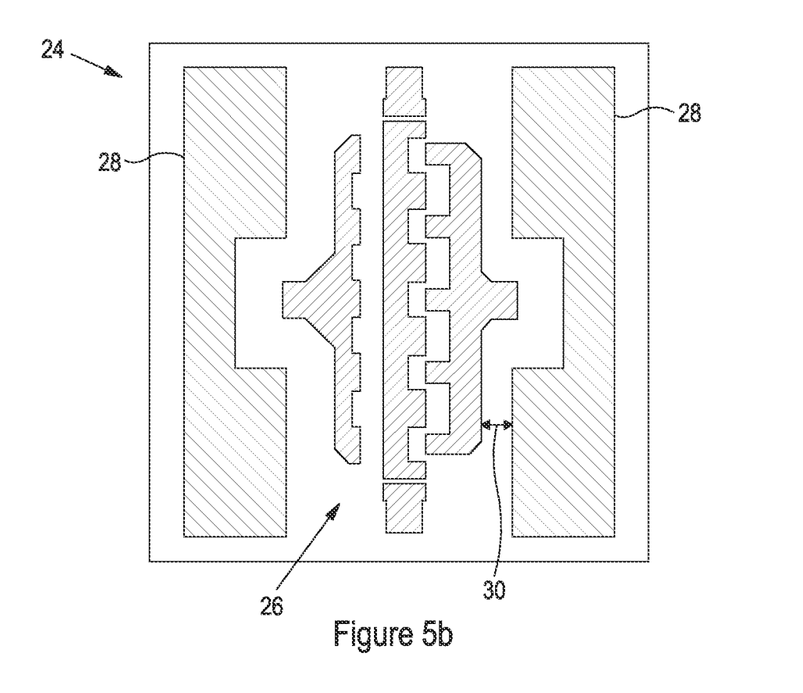
FIG. 5b is a schematic top view of the second GaN chiplet with a dummy metal layer.

FIG. 5b shows a schematic top view of a corresponding GaN chiplet 24 comprising the same GaN device and device metal layer 26, and further comprising a dummy metal layer 28. The dummy metal layer 28 has substantial mirror symmetry across the y axis. The dummy metal layer 28 is arranged relative to the device metal layer 26 so that there is a gap 30 between them. The gap 30 has a width of at least 30 µm to minimize its influence on the GaN device through capacitive effects (other embodiments may have a smaller gap, but where the width of the gap is at least 10 µm). The device metal layer 26 covers 16.4% of the surface area of the chiplet 24 and the dummy metal layer 28 covers 19.5% of the surface area of the chiplet, such that a total of 35.9% of the surface area of the chiplet is covered by metal (i.e. 35.9% total chiplet density).

Figure 6:
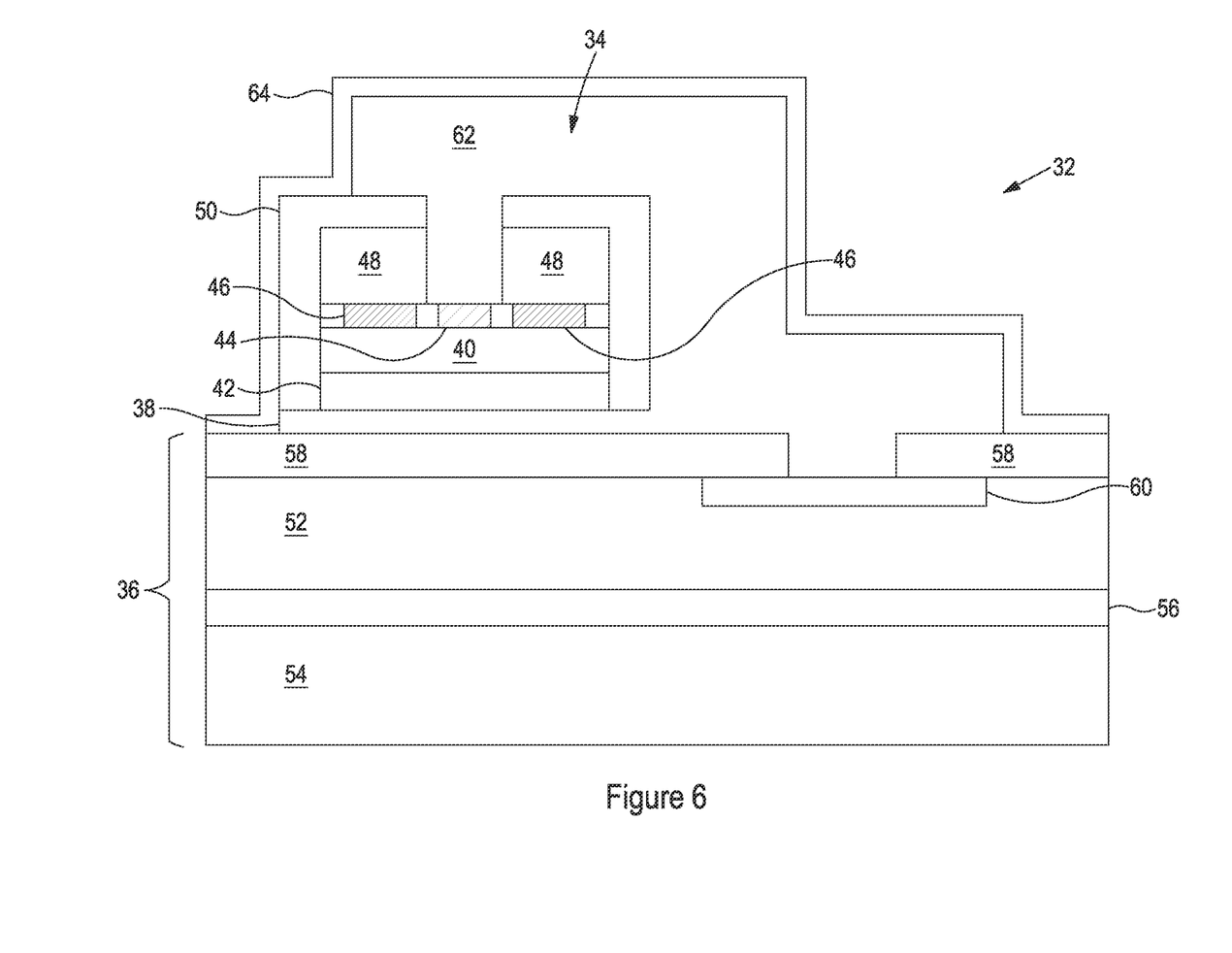
FIG. 6 is a schematic cross section of a semiconductor structure comprising a micro-transfer printed GaN chiplet on an SOI wafer.

FIG. 6 shows a schematic diagram of a cross-section of a part of a semiconductor structure for RF applications 32. The semiconductor structure comprises a µTP GaN chiplet 34 attached to a SOI wafer 36 by a layer of glue 38. The GaN chiplet 34 comprises a GaN layer 40 on a buffer layer 42, a device metal layer 44, and dummy metal layer 46. The GaN layer 40 has a thickness of approximately 1.8 µm and the buffer layer 42 has a thickness of approximately 1 µm. The dummy metal layer 46 may have a thickness of 1.25 µm. A passivation layer 48 comprising one or more dielectric layers covers the top metal of the back-end stack 49 including the dummy metal layer 46. The chiplet 34 is partly enclosed in a protective encapsulation layer 50 formed before release from the native substrate (not shown). The SOI wafer 36 comprises an upper silicon layer 52 (e.g. an epitaxial layer) and a lower silicon layer 54 separated by an insulator layer 56 (typically comprising oxide). A passivation layer 58 (e.g. SiON) covers the upper silicon layer 52. The upper silicon layer 52 of the 301 wafer 36 is illustrated as a single layer but comprises the full back-end (all metal layers), dielectric layers to separate the metallization and the silicon layer used to create the active part of the SOI device. The passivation layer 58 is patterned to expose a top metal layer connection pad 60 (e.g. an aluminium pad) in the SOI wafer 36. The GaN chiplet 34 is electrically connected to the SOI wafer 36 by a copper redistribution layer (RDL) 62, which is connected to the device metal layer 44 of the GaN chiplet 34 and to the top metal layer connection pad 60 of the SOI wafer 36. Another passivation layer 64 covers the RDL 62, the GaN chiplet 34 and the 301 wafer 36. This passivation layer 64 may eventually be opened to allow for connections with other circuits, PCBs and/or other structures for connecting with.

Figure 7:
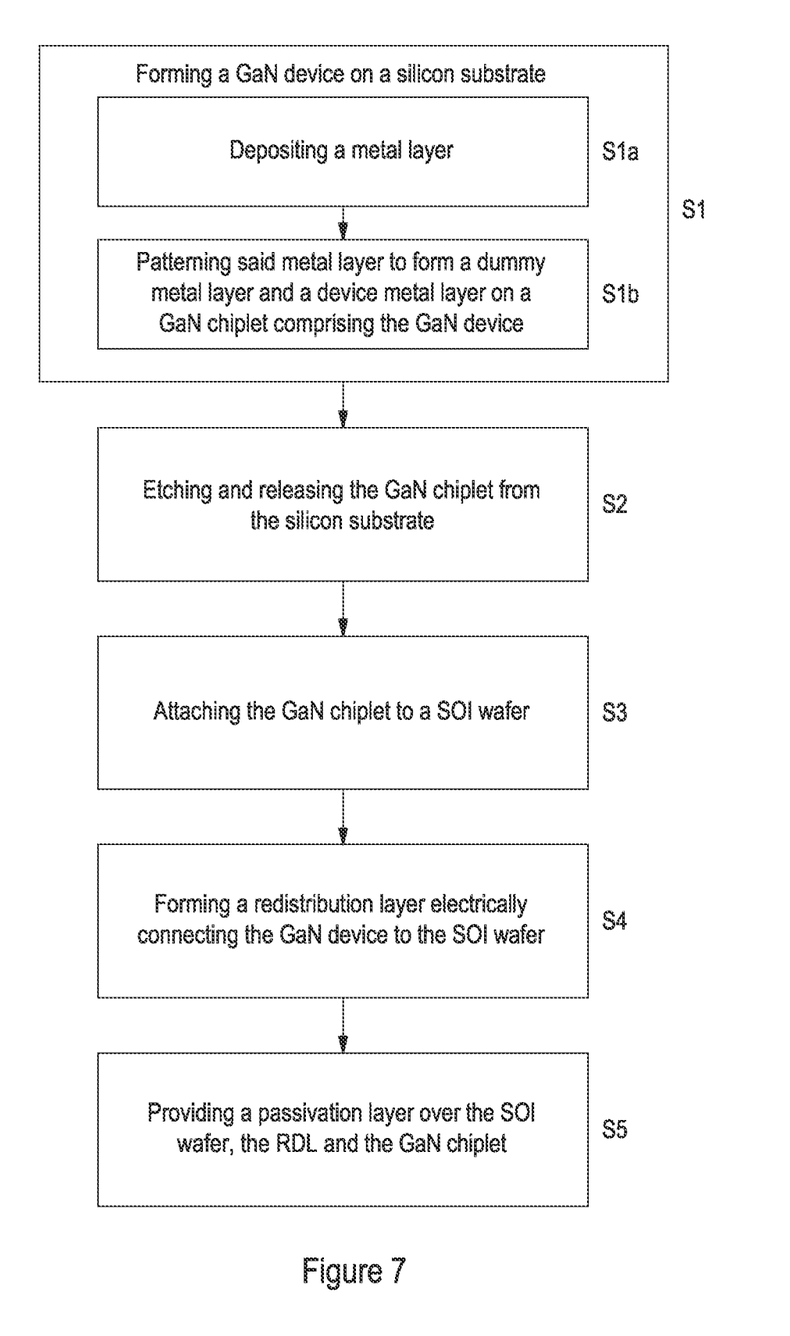
FIG. 7 is a flow diagram illustrating the steps of a method of forming a semiconductor structure for RF applications.

FIG. 7 is a flow diagram illustrating the steps of a method of forming a semiconductor structure. The method comprises forming a GaN device (e.g. a p-HEMT) on a silicon substrate (e.g. a high resistivity silicon substrate) (step S1), wherein said step of forming the GaN device comprises depositing a metal layer (step S1a) and patterning said metal layer to form a dummy metal layer and a device metal layer on a GaN chiplet comprising the GaN device (step S1b). The method further comprises etching and releasing a GaN chiplet from the silicon substrate (step S2), attaching the GaN chiplet to a SOI wafer (step S3), and forming a RDL electrically connecting the GaN device to the SOI wafer (step S4). Typically, the RDL is formed to connect the top metal layer of the GaN device to the top metal layer of a semiconductor device in the SOI wafer. The method further comprises, providing a passivation layer over the SOI wafer, the RDL and the GaN chiplet (step S5). Prior to releasing the GaN chiplet from the native substrate, the method may comprise depositing an encapsulation layer to cover the GaN chiplet.

While specific embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

The invention claimed is:

1. A semiconductor structure for RF applications comprising:
   a target substrate; and
   a micro-transfer printed (µTP) gallium nitride (GaN) chiplet on said target substrate, wherein said µTP GaN chiplet comprises:
      a GaN device;
      a backend stack of the GaN device comprising a plurality of metal layers and dielectric layers, wherein said plurality of metal layers comprises a top metal layer covered by a passivation layer, wherein said top metal layer comprises:
         a device metal layer comprising metal contacts for connecting to said GaN device; and
         a dummy metal layer without electrical connections, wherein said device metal layer and said dummy metal layer are separated by a gap, and wherein said dummy metal layer is arranged to increase a mechanical strength of the µTP GaN chiplet by having a thickness in the range of 0.3 µm to 4 µm and by together with said device metal layer covering between 20% and 90% of a total surface area of said µTP GaN chiplet.

2. The semiconductor structure according to claim 1, wherein said target substrate is a silicon on insulator (SOI) wafer or die.

3. The semiconductor structure according to claim 1, wherein said µTP GaN chiplet comprises a buffer layer and a GaN layer on said buffer layer and wherein the combined thickness of said buffer layer and said GaN layer is less than 3 µm.

4. The semiconductor structure according to claim 3, wherein said GaN layer has a thickness of 1.8 µm.

5. The semiconductor structure according to claim 1, wherein said dummy metal layer has a thickness of 1.25 µm.

6. The semiconductor structure according to claim 1, wherein said dummy metal layer is substantially symmetrically arranged on said µTP GaN chiplet.

7. The semiconductor structure according to claim 1, wherein said gap between said dummy metal layer and said device metal layer has a width of at least 10 µm.

8. The semiconductor structure according to claim 1, wherein said dummy metal layer and said device metal layer are arranged so that metal is substantially uniformly distributed on said µTP GaN chiplet.

9. The semiconductor structure according to claim 1, further comprising an encapsulation layer covering said µTP GaN chiplet.

10. The semiconductor structure according to claim 9, wherein said encapsulation layer has a thickness in the range of 0.5 µm to 3 µm.

11. A method of forming a semiconductor structure for RF applications, said method comprising:
  providing a gallium nitride (GaN) chiplet comprising a GaN device, a backend stack of the GaN device comprising a plurality of metal layers and dielectric layers, wherein said providing comprises:
    depositing a top metal layer of the plurality of metal layers and patterning said metal layer to form a device metal layer comprising metal contacts for connecting to said GaN device and a dummy metal layer without electrical connections, wherein said device metal layer and said dummy metal layer are separated by a gap, and wherein said dummy metal layer is arranged to increase a mechanical strength of said GaN chiplet by having a thickness in the range of 0.3 µm to 4 µm and by together with said device metal layer covering between 20% and 90% of a total surface area of said GaN chiplet;
  providing a passivation layer that covers said top metal layer; and
  micro-transfer printing of said GaN chiplet onto a target substrate, wherein a glue layer is provided between said GaN chiplet and said target substrate for attaching said GaN chiplet to said target substrate.

12. The method according to claim 11, wherein said step of micro-transfer printing comprises depositing an encapsulation layer covering said GaN chiplet before said GaN chiplet is released from a native substrate.

* * * * *